(12) United States Patent
Lupo

(10) Patent No.: US 10,106,049 B2
(45) Date of Patent: Oct. 23, 2018

(54) BATTERY MONITORING DEVICE

(71) Applicant: Freescale Semiconductor, Inc., Austin, TX (US)

(72) Inventor: Savino Luigi Lupo, Munich (DE)

(73) Assignee: NXP USA, Inc., Austin, TX (US)

( * ) Notice: Subject to any disclaimer, the term of this patent is extended or adjusted under 35 U.S.C. 154(b) by 213 days.

(21) Appl. No.: 15/157,871

(22) Filed: May 18, 2016

(65) Prior Publication Data

US 2017/0334306 A1   Nov. 23, 2017

(51) Int. Cl.
*B60L 11/18* (2006.01)
*G01R 31/36* (2006.01)
(Continued)

(52) U.S. Cl.
CPC .......... *B60L 11/1861* (2013.01); *B60W 10/08* (2013.01); *B60W 10/26* (2013.01);
(Continued)

(58) Field of Classification Search
CPC .............. G01R 31/362; G01R 31/3651; G01R 31/3679; G01R 31/3606; G01R 31/3658;
(Continued)

(56) References Cited

U.S. PATENT DOCUMENTS 4,564,798 A * 1/1986 Young ................. B60L 11/1861
320/103
5,047,961 A   9/1991 Simonsen
(Continued)

FOREIGN PATENT DOCUMENTS

CN 102944859 A 2/2013
CN 104166057 A 11/2014
(Continued)

OTHER PUBLICATIONS

Forchert et al., Powering Unmanned Aerial Vehicles, Lithium Battery Safe Containment, Battery University, 12 pages.
(Continued)

*Primary Examiner* — Anne M Antonucci
*Assistant Examiner* — Sanjeev Malhotra

(57) ABSTRACT

A battery monitoring device suitable for monitoring performance of one or more battery cells, such as with respect to a battery pack powering a vehicle. The battery monitoring device includes a signal injector configured to produce a replacement physical set that emulates one or more physical properties associated with the one or more battery cells, a multiplexer configured to selectively output, during different periods of time, the replacement physical set received from the signal injector or a physical set of physical properties received from the one or more battery cells, a sensor circuit configured to separately convert the physical set to a first signal set representing a first digitized measurement of the physical set and the replacement physical set to a second signal set representing a second digitized measurement of the replacement physical set, and a controller configured to compare the first signal set to the second signal set for a variance outside of a predetermined threshold. The controller may be configured to output a switch command suitable to switch the one or more battery cells into a safe state. The replacement physical set may be predetermined physical quantities that emulate a threshold range of physical properties produced during normal or safe operation of the one or more battery cells.

20 Claims, 10 Drawing Sheets

(51) Int. Cl.
*B60W 10/08* (2006.01)
*B60W 10/26* (2006.01)
*B60W 30/18* (2012.01)

(52) U.S. Cl.
CPC ......... *B60W 30/18* (2013.01); *G01R 31/3648* (2013.01); *G01R 31/3658* (2013.01)

(58) Field of Classification Search
CPC ....... H01M 2010/4271; H01M 10/425; H01M 10/482; B60L 11/1861; B60L 11/1803; B60L 11/1838; B60L 11/1857; H02J 7/0014; H02J 7/0021
USPC ..... 702/63, 45; 360/31; 324/426, 433, 99 R, 324/427; 320/125, 134, 103, 107, 118, 320/132, 150; 429/50; 318/139; 701/1, 701/2, 36; 703/13; 307/48; 356/73.1; 327/276
See application file for complete search history.

(56) References Cited

U.S. PATENT DOCUMENTS

| | | | | |
|---|---|---|---|---|
| 5,184,025 | A * | 2/1993 | McCurry | G06F 1/28 307/48 |
| 5,349,535 | A | 9/1994 | Gupta | |
| 5,349,540 | A * | 9/1994 | Birkle | G01R 31/361 324/427 |
| 5,619,417 | A | 4/1997 | Kendall | |
| 5,646,534 | A | 7/1997 | Kopera | |
| 5,781,013 | A | 7/1998 | Takahashi | |
| 5,869,951 | A | 2/1999 | Takahashi | |
| 7,317,298 | B1 * | 1/2008 | Burns | H01M 10/46 320/107 |
| 7,423,409 | B1 * | 9/2008 | Burns | H01M 10/48 320/132 |
| 7,479,764 | B1 * | 1/2009 | Burns | H01M 10/46 320/150 |
| 7,612,540 | B2 | 11/2009 | Singh | |
| 7,619,417 | B2 | 11/2009 | Klang | |
| 8,901,888 | B1 * | 12/2014 | Beckman | H01M 2/1022 320/125 |
| 2003/0004618 | A1 | 1/2003 | Weigl | B60R 25/24 701/2 |
| 2005/0228562 | A1 * | 10/2005 | Sayama | G04G 15/00 701/36 |
| 2006/0200276 | A1 * | 9/2006 | Sayama | H02J 9/061 701/1 |
| 2007/0271044 | A1 * | 11/2007 | Gutierrez | G01F 15/024 702/45 |
| 2008/0252257 | A1 * | 10/2008 | Sufrin-Disler | B60L 3/0046 320/118 |
| 2011/0050278 | A1 * | 3/2011 | Wortham | H02J 7/0021 324/99 R |
| 2013/0346052 | A1 * | 12/2013 | Valerio | G06F 17/5036 703/13 |
| 2013/0346783 | A1 | 12/2013 | Weber | |
| 2014/0129164 | A1 * | 5/2014 | Gorbold | G01R 31/362 702/63 |
| 2014/0211335 | A1 * | 7/2014 | Bui | G11B 20/10388 360/31 |
| 2014/0225620 | A1 * | 8/2014 | Campbell | B60L 11/1838 324/426 |
| 2014/0225622 | A1 | 8/2014 | Kudo et al. | |
| 2014/0320143 | A1 | 10/2014 | Butzmann et al. | |
| 2014/0358346 | A1 | 12/2014 | Katrak et al. | |
| 2014/0361743 | A1 | 12/2014 | Lin et al. | |
| 2014/0368168 | A1 * | 12/2014 | Beckman | H02J 7/0021 320/134 |
| 2015/0015267 | A1 | 1/2015 | Mueller et al. | |
| 2015/0046108 | A1 | 2/2015 | Akamine | |
| 2015/0331061 | A1 * | 11/2015 | Hirschbold | G01R 31/3679 324/433 |
| 2016/0003919 | A1 * | 1/2016 | Hirschbold | G01R 31/362 324/433 |
| 2016/0018319 | A1 * | 1/2016 | Hegyi | G02B 6/12009 356/73.1 |
| 2016/0043707 | A1 * | 2/2016 | Bhatia | H03K 5/13 327/276 |
| 2016/0084911 | A1 * | 3/2016 | Mensah-Brown | G01N 29/022 318/139 |
| 2016/0093927 | A1 * | 3/2016 | Marcicki | H01M 10/0525 429/50 |
| 2016/0231388 | A1 * | 8/2016 | Park | G01R 31/3679 |
| 2017/0040646 | A1 * | 2/2017 | Beaston | H01M 10/425 |
| 2017/0108552 | A1 * | 4/2017 | Roumi | G01R 31/3651 |
| 2017/0207640 | A1 * | 7/2017 | Wang | H02J 7/0021 |

FOREIGN PATENT DOCUMENTS

| | | |
|---|---|---|
| DE | 102012211092 A1 | 1/2014 |
| EP | 1993185 A2 | 11/2008 |
| EP | 2085784 A2 | 8/2009 |
| EP | 1993185 A3 | 8/2012 |
| WO | 2014/191794 A1 | 12/2014 |

OTHER PUBLICATIONS

Freescale Semiconductor Advance Information, Battery Cell Controller IC, Document No. MC33771, Rev. 3M preview Aug. 2015, 118 pages.

Freescale Semiconductor Advance Information, Intelligent Battery Sensor with CAN and LIN, Document No. MM9Z1_638D1, Rev. 3.0, May 2014, 443 pages.

Freescale Analog, Analog Solutions-Robust Reliable Performance, MC33771 and MC33664 Battery Cell Controller and Transformer Physical Layer, 2 pages.

Freescale Semiconductor Data Sheet: Technical Data, MPC5744P Data Sheet, Document No. MPC5744P, Rev. 4, Jan. 2015, 120 pages.

Freescale Semiconductor Product Brief, MPC5744P Product Brief, Document No. MPC5744PPB, Rev. 2, Jun. 2012, 36 pages.

Analog, Mixed-Signal and Power Management, MM9Z1_638 and MM9Z1_638C, Xtrinsic Battery Sensor with Multiple Voltage and Temperature Sense Inputs, MSCAN and LIN, 2 pages.

Freescale Qorivva, Qorivva MPC574xP Family, MCUs built on Power Architecture technology for safety and chassis applications, 2 pages.

Powering Wireless Communications, What everyone should know about Battery Chargers, pp. 1-7. Download at http://batteryuniversity.com/learn/article/what_everyone_should_know_about_battery_chargers.

International Standard, Road vehicles—Functional safety—Part 5: Product development at the hardware level, ISO 26262-5, First edition, Nov. 15, 2011.

Rydberg, M. et al., IEEE Transactions on Electron Devices, "Long-Term Stability and Electrical Properties of Compensation Doped Poly-Si IC-Resistor", vol. 47, No. 2, Feb. 2000. (Requested).

* cited by examiner

BATTERY MONITORING DEVICE

FIELD

The present invention relates in general to a battery monitoring device such as for monitoring a series of rechargeable batteries.

BACKGROUND

As batteries, particularly rechargeable batteries (e.g., lithium-ion batteries), become increasingly utilized, it is important to monitor the states of these batteries for safety reasons and to ensure their efficient and effective utilization. This can be of particular concern with the use of such rechargeable lithium-ion batteries in vehicles, because of the need for many battery cells connected in series with each other. Lithium-ion batteries are safe, provided certain precautions are met when charging and discharging.

Such battery packs are often implemented with a battery monitoring device to maintain the cells in the battery pack within a safe operating state, which may include a protection circuit that limits the peak voltage of each battery cell during charge and prevents the cell voltage from dropping too low on discharge. Additionally, the temperatures of the cells may be monitored to prevent temperature extremes, since lithium-ion batteries are at risk of a self-initiated exothermal reaction, often referred to as thermal runaway. Overloading of a lithium-ion battery can set it on fire, which is not easily extinguished. During a thermal runaway, the high heat of the failing cell can propagate to the next cell, causing it to become thermally unstable as well. Thus, such a battery monitoring device may include protection circuitry to maintain the various cells' voltages and currents within safe limits so that the battery cells are in a safe operating state.

Rechargeable batteries are often configured as clusters or stacks of such batteries arranged into battery arrays, packs, or series-connected strings (collectively referred to herein as "battery packs"). A battery pack may include two or more cells coupled in series, with a number of series cell strings connected in parallel as an option. In multi-cell battery packs, problems may arise due to differences in the characteristics of the individual cells, i.e., cell capacities and/or cell charges. A difference in the cell ampere-hour capacities and/or cell charges may be referred to as cell imbalance. In a new battery pack, the cells generally start off well balanced. Cell imbalance may develop, however, due to aging or other causes, such as, for example, insertion of different grade cells due to repair, battery misuse, or differences in the active material quality of the cells at the time of cell manufacturing. Because of these and other problems resulting from cell imbalance, cell balancing techniques may be required to equalize the charge and/or capacity on every cell and/or prevent individual cells from becoming overstressed (i.e., functioning outside of a safe operating state).

This Background section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

DETAILED DESCRIPTION OF THE DRAWINGS

Figure 1:
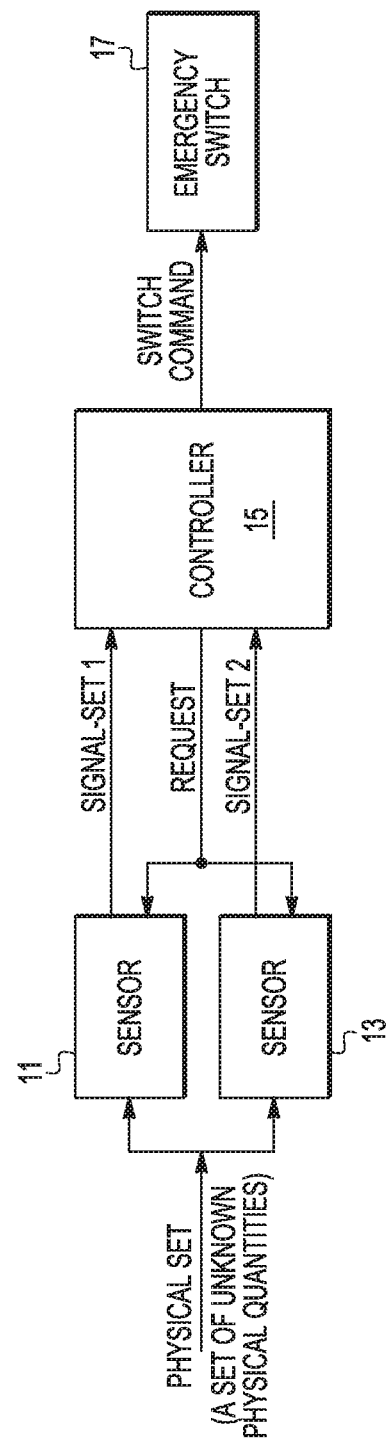
FIG. 1 illustrates a block diagram of a battery monitor utilizing two sensors for redundancy.

Aspects of the present disclosure provide a battery monitoring device to diagnose and/or determine impending cell imbalance and/or unsafe operating conditions of a battery pack. Aspects of the present disclosure provide an implementation of a battery monitoring device that achieves a high safety integrity level (SIL or ASIL (Automotive Safety Integrity Level)) in a cost effective manner. Aspects of the present disclosure provide a battery monitoring device implementing functional redundancy by measuring once a set of known physical properties and then checking for expected results, whereas common solutions rely on normal redundancy, e.g., by measuring twice the same set of unknown physical properties (by using two measuring devices) and checking for quality of results. FIG. 1 illustrates a block diagram of such a utilization of two sensor circuits, sensor 11 and sensor 13. Each of the sensors 11 and 13 measures the same set of unknown physical properties, referred to herein as the Physical Set, which is mapped (i.e., converted) into a set of corresponding signals, referred to herein as the signal-set 1 and signal-set 2. The controller 15 sends a signal to the sensors 11 and 13 to begin the measurements of the Physical Set, and then reads both of the signal-sets 1 and 2 at a frequency rate of f=1/T, and compares them component by component (i.e., the controller 15 checks, within certain predetermined tolerances, for the equality/inequality of a measurement of a physical property of any component). A component may be any specified part or portion of a battery cell or group of battery cells.

The Physical Set may include a set of voltages across one or more battery cells of a battery pack and/or a current flowing within the battery pack. If a variance (i.e., an inequality (outside of a predetermined threshold) of a measured physical property of a component (e.g., battery cell)) occurs K times out of N consecutive times, with K<N, where DT=N*T is the system fault tolerant time interval ("FTTI"), this may indicate that the battery pack is no longer operating within a safe operating state. In such an instance, the controller 15 opens a normally closed emergency switch actuator 17 with a switch command (for example, by disconnecting a battery charging source). A problem with the foregoing solution is that it lacks cost effectiveness, such as the need for two redundant sensors.

Figure 2:
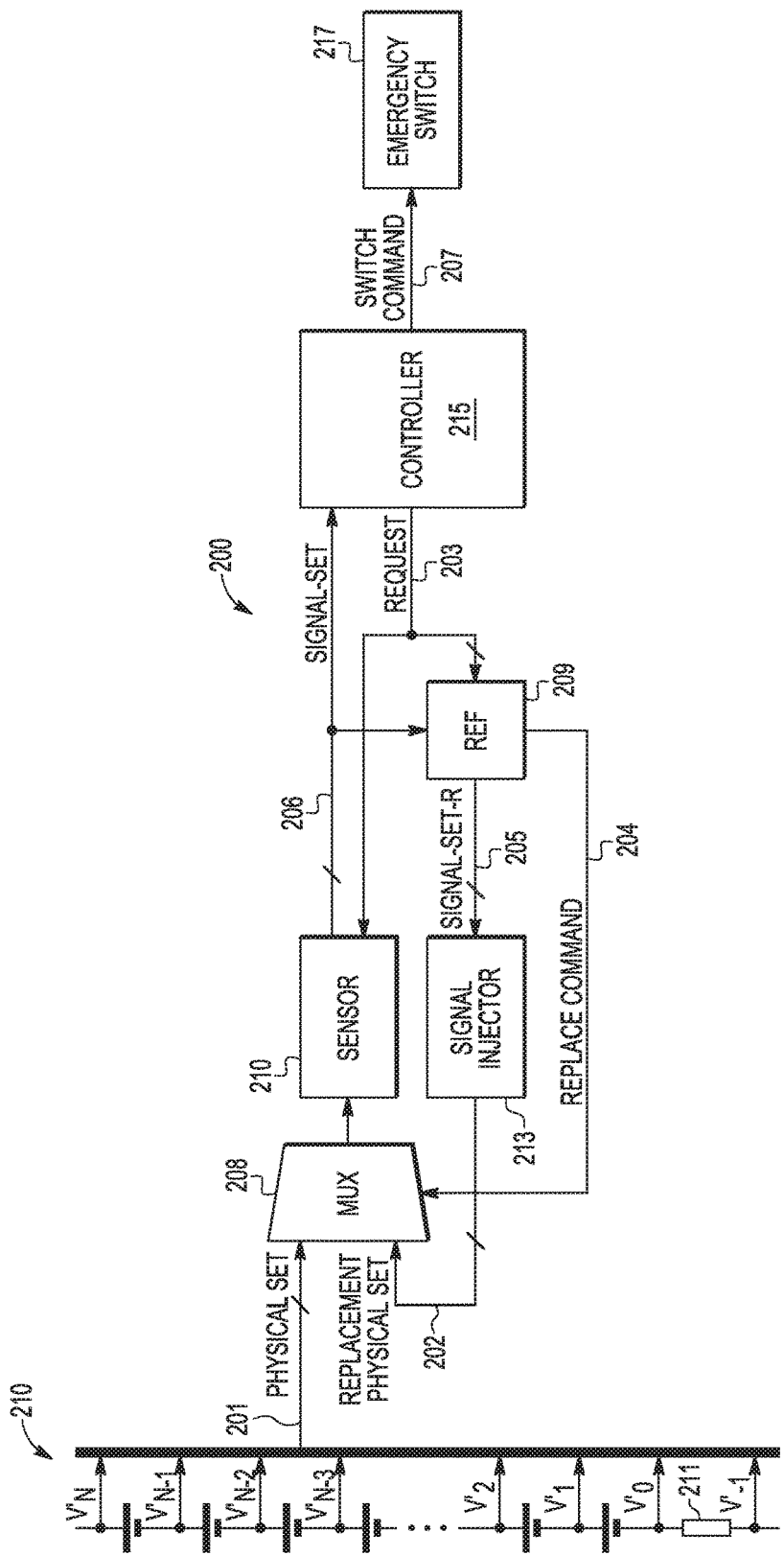
FIG. 2 illustrates a block diagram of a battery monitoring device in accordance with embodiments of the present invention.
Figure 3:
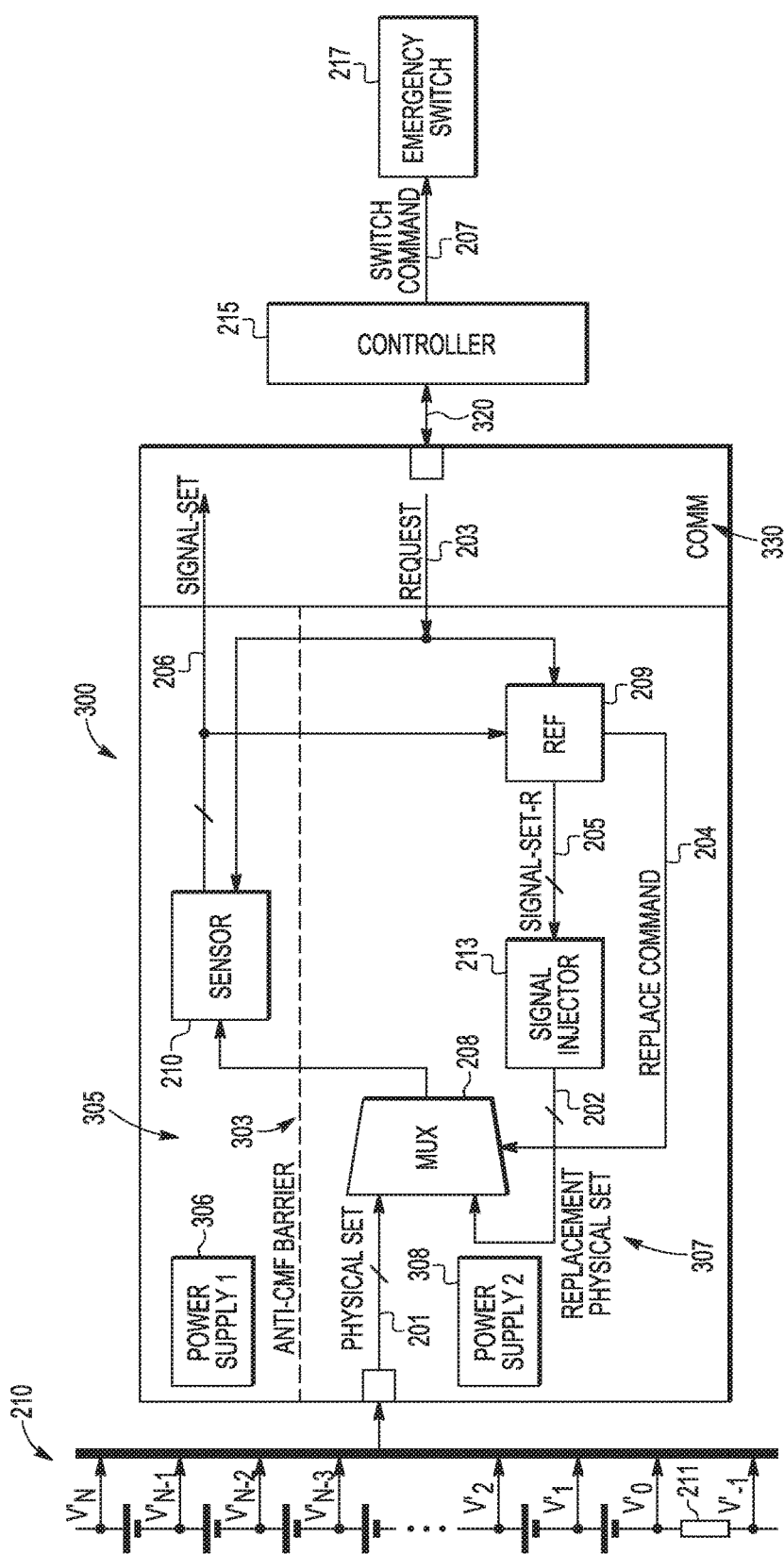
FIG. 3 illustrates a block diagram of a battery monitoring device in accordance with embodiments of the present invention.

FIGS. 2 and 3 illustrate block diagrams of battery monitoring devices configured in accordance with various embodiments of the present invention. Within such embodiments, certain components are configured to emulate a preselected behavior (e.g., one or more physical properties) of a battery pack. Such components may at least replace the circuitry that previously implemented the sensor 13. Furthermore, the components can enhance the safety of a single battery monitoring integrated circuit solution and/or be embeddable in a single battery monitoring integrated circuit.

Referring to FIG. 2, embodiments of the present invention implement the Signal Set circuitry 200, which may include a sensor circuit 210, a signal injector 213, a multiplexer ("MUX") 208, and a reference ("REF") circuit 209. The Signal Set circuitry 200 is coupled to a controller 215. The signal injector 213 produces a set of known physical properties, referred to herein as the Replacement Physical Set resulting from a transformation of a set of known signals, labeled as Signal-Set-R 205 in FIG. 2. The Replacement Physical Set may represent an emulation of a Physical Set (described hereinafter) produced by the battery cells when the battery pack 210 is operating normally and/or safely (i.e., within a safe operating state). As will be described in more detail herein, the reference circuit 209 assists the controller 215 in managing the timing of the sensing of the Physical Set and the Replacement Physical Set. The multiplexer 208 receives at its inputs the Physical Set and the Replacement Physical Set. The multiplexer 208 performs a selective (e.g., periodic) output between the Physical Set and the Replacement Physical Set for input into the sensor circuit 210.

Note that the Replacement Physical Set is referred to herein as representing one or more known physical properties of the one or more battery cells of the battery pack 210, because these values are what are expected (i.e., known) to be produced by the one or more battery cells of the battery pack 210 (e.g., when functioning within a safe operating state). The Physical Set is referred to herein as representing the one or more unknown physical properties of the one or more battery cells of the battery pack 210, because these values are the physical properties received from the one or more battery cells of the battery pack 210 while they are in actual operation ("unknown" because they result from the future operation of the one or more battery cells of the battery pack 210).

In accordance with certain embodiments of the present invention, the Physical Set may include a set of voltages across one or more battery cells within the battery pack 210, and/or a current (or, the voltages associated with a current shunt 211) flowing within the battery pack 210.

Embodiments of the present invention may also measure and compare other physical properties associated with the battery cells of the battery pack 210, such as the measured temperatures of the various battery cells. Essentially, embodiments of the present invention may implement a battery monitoring device that measures and compares any one or more physical properties associated with one or more battery cells of a battery pack (herein referred to as the "Physical Set").

The sensor circuit 210 senses (e.g., measures) the Physical Set or the Replacement Physical Set, as the case may be, to produce the Signal-Set 206. When it receives the Physical Set 201 via the multiplexer 208, the sensor circuit 210 produces a first Signal-Set 206, for example, by measuring the physical properties associated with the Physical Set 201 (e.g., voltage(s), current(s), temperature(s), or any other physical properties that may be monitored or sensed from the battery cells) received from the battery pack 210. When the sensor circuit 210 receives the Replacement Physical Set 202 via the multiplexer 208, the sensor circuit 210 produces a second Signal-Set 206, for example, by measuring the physical quantities produced by the signal injector 213, which may emulate the physical properties (or at least a threshold range of such physical properties) of one or more cells of the battery pack 210 produced during normal and/or safe operation. Such sensor circuitry is well known in the art, and may implement any suitable configuration of circuitry (e.g., analog-to-digital converters) for measuring the received physical properties to produce corresponding digitized versions of such measurements.

As will be further described herein, the controller 215 sends a Request signal 203 to the sensor circuit 210 and the reference ("REF") circuit 209 to provide the Signal-Set-R signal(s) 205, and the Replace Command 204 for instructing the multiplexer 208 to selectively (e.g., periodically) output the received Physical Set 201 or the received Replacement Physical Set 202.

For example, since it is often desired, but not necessary, that the multiple cells of a battery pack are in balance with each other, the controller 215 may be configured to compare the measured voltages across each of the battery cells of the battery pack 210 to expected voltage values as emulated within the Replacement Physical Set 202 to monitor for differences between them beyond a predetermined threshold variance. In a similar manner, a current passing through one or more battery cells of the battery pack 210 may be compared by the controller 215 to an expected current value as emulated within the Replacement Physical Set.

In general, the Physical Set and the Replacement Physical Set are each vectors, i.e., they may be composed of more than one scalar signal. For example, the Physical Set 201 may represent a set of voltages sensed from battery cells of the battery pack 210, as well as a difference of potential of a pair of voltages (e.g., sensed from a micro-shunt 211) for representing a current flowing within battery cells of the battery pack 210. The Replacement Physical Set 202 may then be a vector having the same size as the vector of the Physical Set 201.

Note that the circuitry including the reference circuit 209, the signal injector 213, and the multiplexer 208 can be configured to inject arbitrary patterns into the input of the sensor circuit 210. Such arbitrary patterns are thus known to the controller 215, which can then check for the integrity of the sensor circuit 210 by comparing each received vector from the battery pack 210 with the corresponding expected vector generated by the controller 215.

As shown in FIG. 3, the sensor circuit 210, the multiplexer 208, the signal injector 213, and the reference circuit 209 (collectively labeled in FIG. 3 as the Signal Set 300) may all be implemented on a single integrated circuit chip in certain embodiments of the present invention. Additionally, in some embodiments of the present invention, the sensor circuit 210 may be implemented, along with its power supply 306, on a portion 305 of the integrated circuit chip that is separated by an anti-CMF (common mode failure) barrier 303 from the portion 307 of the integrated circuit chip implementing the multiplexer 208, the signal injector 213, and the reference circuit 209, and their associated power supply 308, thus providing protection against common mode failures due to, e.g., common semiconductor area, common temperature, and other common factors.

Note that within embodiments of the present invention the integrated circuit chip may also include communication ("COMM") circuitry 330 for communicating the Signal-Set 206 and Request 203 signals to/from the controller 215 via the communication link 320.

Figure 6:
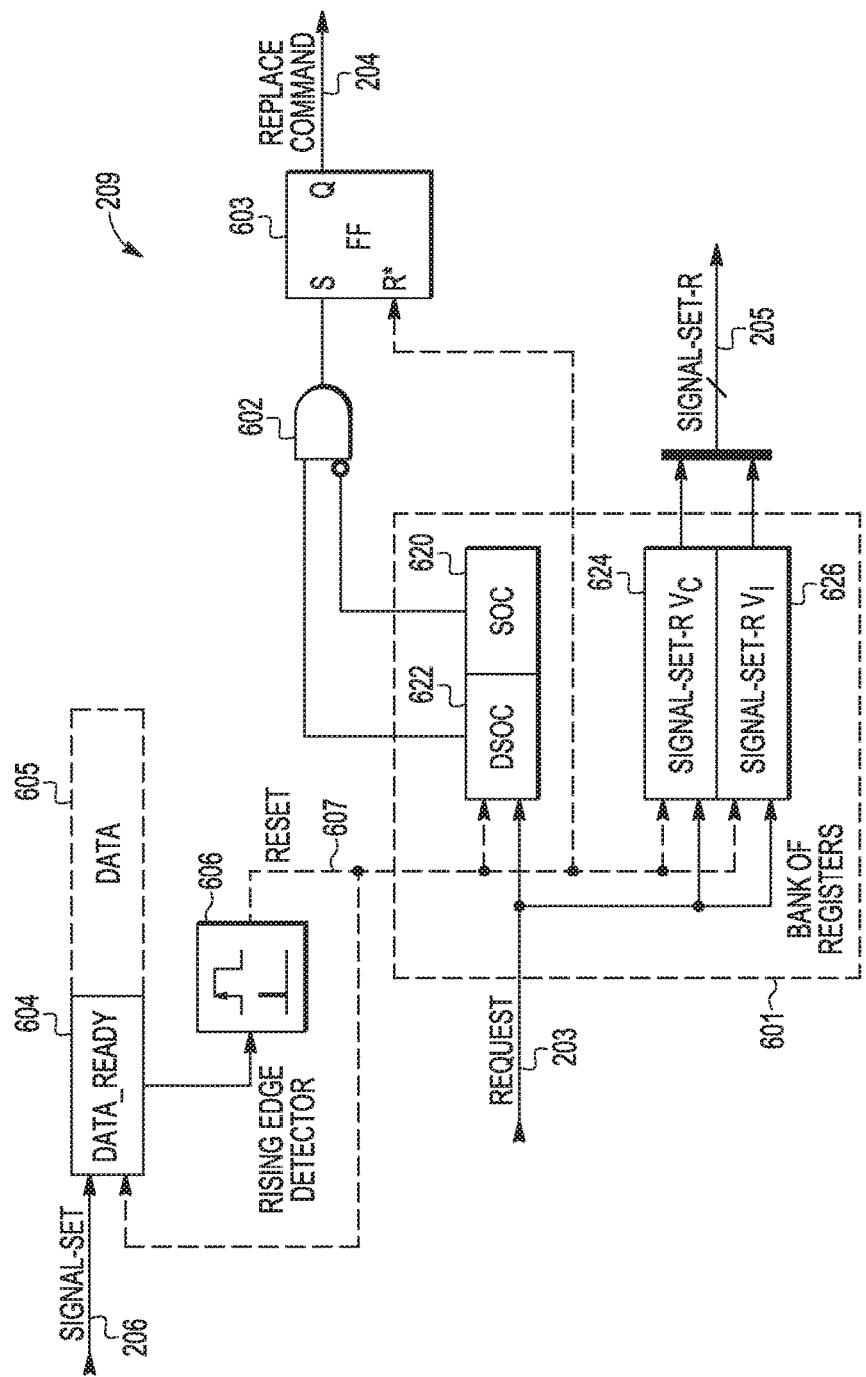
FIG. 6 illustrates a circuit diagram for producing a Signal-Set signal and a Replace Command signal in accordance with embodiments of the present invention.

Before describing an exemplary operation of embodiments of the present invention, refer to FIG. 6, where there is illustrated a block diagram of exemplary circuitry that may be implemented to perform the functionality embodied within the reference circuit 209. The reference circuit 209 may implement a bank of registers 601 for storing various data. For example, a SOC register 620 may store a SOC bit (described hereinafter) received from the controller 215 on the Request line 203. Likewise, the DSOC register 622 may store a DSOC bit (described hereinafter) received from the controller 215 on the Request line 203 (a DSOC event). A Signal-Set-R $V_C$ register 624 may receive an average voltage set-point value from the controller 215. A Signal-Set-R $V_I$ register 626 may receive from the controller 215 a set-point value representing the current. The Signal-Set-R 205 contains both of the average voltage (Signal-Set-R $V_C$) set point value and the current (Signal-Set-R $V_I$) set point value.

The controller 215 may be configured so that the Signal-Set-R $V_C$ set point value represents an average voltage set point, which may represent the entire range of voltages within the battery cells of the battery pack 210, or merely a portion of that range selected in a random manner each time the battery monitoring device performs a cycle of measurements. Alternatively, the controller 215 may be configured to assign, in a deterministic manner, a series of the Signal-Set-R $V_C$ set point values to represent average voltage values spanning some sub-range of the entire voltage range of the battery pack 210. In such an instance, the controller 215 may be configured to explore those sub-ranges that are determined to be most related to performance of the battery pack 210 under safe operating conditions (i.e., during a safe operating state). For example, the Signal-Set-R $V_C$ set point value for the average voltage may be configured to encompass an over-voltage threshold value, or an under-voltage threshold value, known to be important for safely operating the battery pack 210. Likewise, the Signal-Set-R $V_I$ set point value for the battery current may be configured by the controller 215 to represent an over-current threshold, i.e., corresponding to a maximum allowed absolute value of the current within the battery pack 210 under safe operating conditions. As a result, under any one or more of the foregoing examples, the controller 215 may be configured to output the Signal-Set-R 205 (e.g., the Signal-Set-R $V_C$ and/or Signal-Set-R $V_I$ set points) for utilization within the battery monitoring device so that the controller 215 can then compare actual voltages and/or currents (i.e., within the Physical Set) to such set point values within the Signal-Set-R 205 to determine whether such actual values within the Physical Set indicate that the battery pack 210 is operating within a safe operating state.

These foregoing pieces of information may be written to these registers at different time instances. Note that the controller 215 may be configured so that the SOC and the DSOC bits (which are mutually exclusive) are not sent before the set-points information is sent. The DATA_READY bit 604 and the DATA 605 form the Signal-Set 206.

Figure 7:
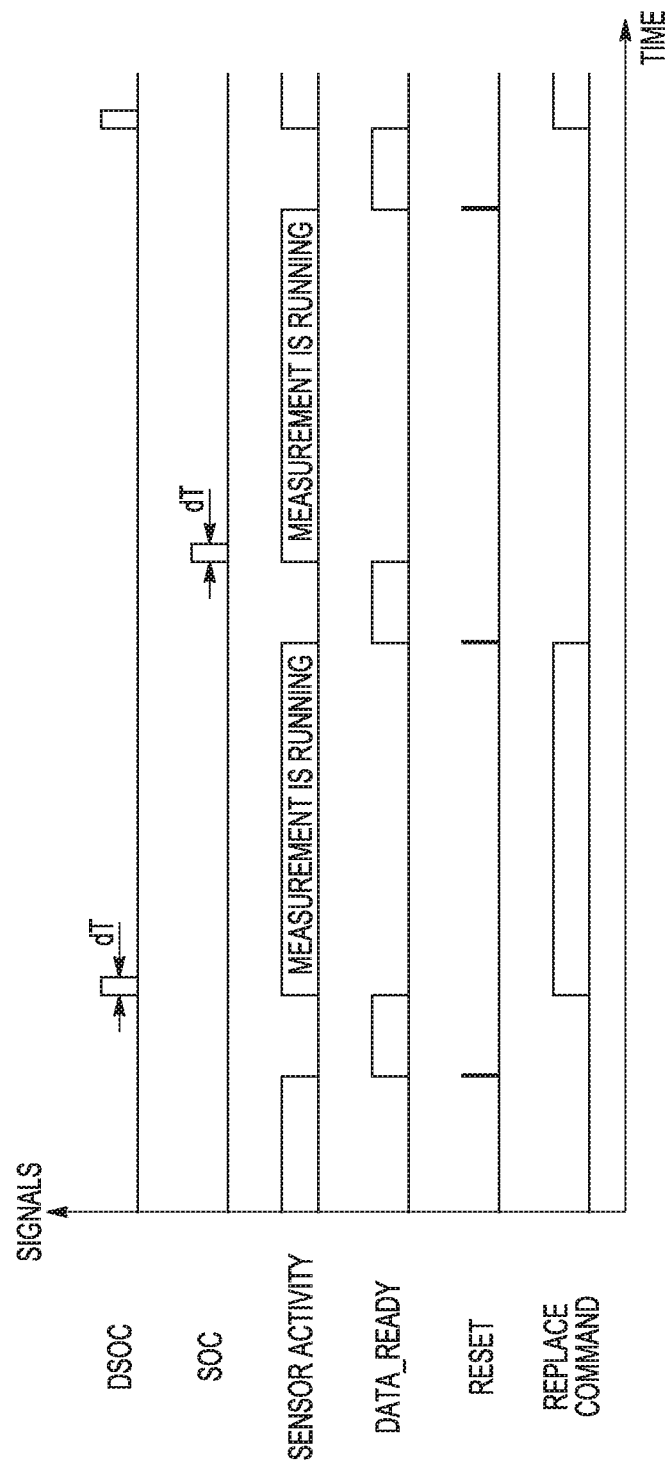
FIG. 7 illustrates a timing diagram of exemplary signals implemented by the circuitry of FIG. 6.

As can be further seen in FIG. 7, the Replace Command signal 204 begins when a DSOC event occurs (e.g., DATA_READY=0 means that a measurement is running; while DATA_READY=1 means that a measurement is ready), and ends when the DATA_READY bit 604 accompanying the DATA 605 (which may be ignored by the reference circuit 209) transitions to a logic 1. The DATA_READY bit 604 is transitioned from a logic 1 to a logic 0 by the sensor circuit 210 when it begins a measurement, and is transitioned from a logic 0 to a logic 1 by the sensor circuit 210 when the measurement ends. The DATA_READY bit 604 is used by the reference circuit 209 in order to timely command its outputs. The reference circuit 209 may be configured to not change the value of its own outputs while the sensor circuit 210 is performing a measurement. As such, the reference circuit 209 may be configured so that its outputs change only after the end of each measurement.

As also seen in FIG. 7, the reference circuit 209 may be configured so that both the SOC and DSOC bits transition back to a logic 0 after a time interval dT. The reference circuit 209 may be configured so that the time interval dT is less than the time requested to run a measurement. Furthermore, the time interval dT may be generated by a timer (not shown) embedded in the rising edge detector 606 from which the resent signal exits on the reset line 607.

As can be interpreted from the exemplary data lines in FIG. 7, the Replace Command signal 204 is sent to the multiplexer 208 when a DSOC event occurs (DSOC bit is a logic 1), and ends when the DATA_READY bit 604 accompanying the DATA 605 transitions to a logic 1. This is a result of the logic 1 from the DSOC register 622 and the logic 0 from the SOC register 620 being received by the logic gate 602, which sends its output to the flip flop 603 for producing the replace command signal 204.

A reset signal 607 will be delivered by the rising edge detector 606 upon receipt of the DATA_READY bit within the Signal-Set 206. Within embodiments of the present invention, the DATA values may be disregarded by the reference circuit 209. The reset signal 607 thus resets the reference circuit 209 so that it is ready for the next cycle of the battery monitoring device, whether it be the measurement of the Physical Set or the Replacement Physical Set.

Figure 8:
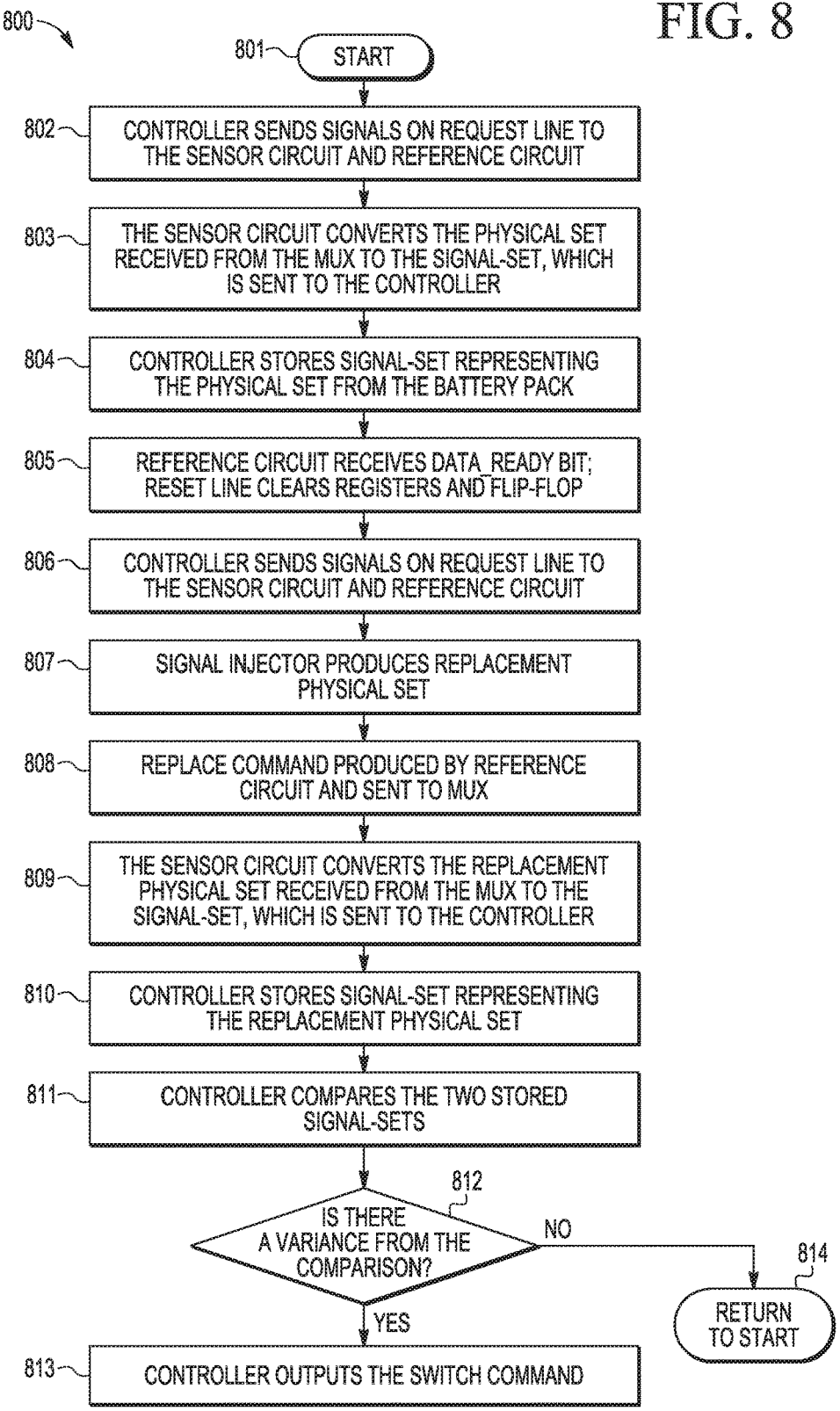
FIG. 8 illustrates a flow diagram of a battery monitoring technique configured in accordance with embodiments of the present invention.

Referring to FIGS. 6-8, an exemplary operation of a battery monitoring device will be described in accordance with embodiments of the present invention (which may be implemented utilizing either the Set Point circuitry 200 of FIG. 2 or the Set Point circuitry 300 of FIG. 3). A process 800 starts at step 801, and proceeds to step 802 where the controller 215 sends a first Request signal 203 (e.g., by activating a proper bit, referred to as a start of conversion event ("SOC")). This Request signal 203 is sent to the sensor circuit 210 and the reference circuit 209 where it may be stored in the SOC register 620. As can be seen in FIG. 7, since after a SOC event, the Replace Command is not asserted (e.g., a logic 0), the multiplexer 208 outputs the Physical Set 201 to the sensor circuit 210. The Replace Command may be a logic 0 as a result of the logic 0 from the DSOC register 622 and/or the initial logic 1 from the SOC register 620, either of which produces a logic 0 output from the logic gate 602 to the flip flop 603. In step 803, the controller 215 reads the output of the sensor circuit 210, i.e., the Signal-Set 206. This causes the sensor circuit 210 to measure the Physical Set output from the multiplexer 208 (see, Measurement is Running activity in FIG. 7) to thereby convert the measured Physical Set to the Signal-Set 206, which is sent to the controller 215. In step 804, the controller 215 may store this version of the Signal-Set 206 in a first set of registers (not shown).

In step 805, the reference circuit 209 also receives the DATA_READY bit and stores it within the register 604. (Note that in some embodiments, the numerical part of the DATA associated with the Signal-Set 206 may be stored within a bank of registers 605 within the reference circuit 209.) Storage of the DATA_READY bit 604 causes the rising edge detector 606 to send out a reset signal on the reset line 607 to clear all of the registers 604, 620, 622, 624, and 626, while also resetting the flip-flop circuit 603.

The controller 215 then sends a second Request signal 203 in step 806, which may be referred to as the replacement request signal (e.g., by activating a proper bit, referred to as the diagnostic start of conversion ("DSOC") event) to the reference circuit 209 and the sensor circuit 210, whereupon the reference circuit 209 sends the Signal-Set-R 205 to the signal injector 213, along with a Replace Command signal 204 to the multiplexer 208. The Signal-Set-R 205 produced by the reference circuit 209 may be an echo of a set of values received by the controller 215, which can send those values at any time. In other words, the Signal-Set-R values received from the controller 215 may be transparently passed by the reference circuit 209 to the signal injector 213.

Figure 4:
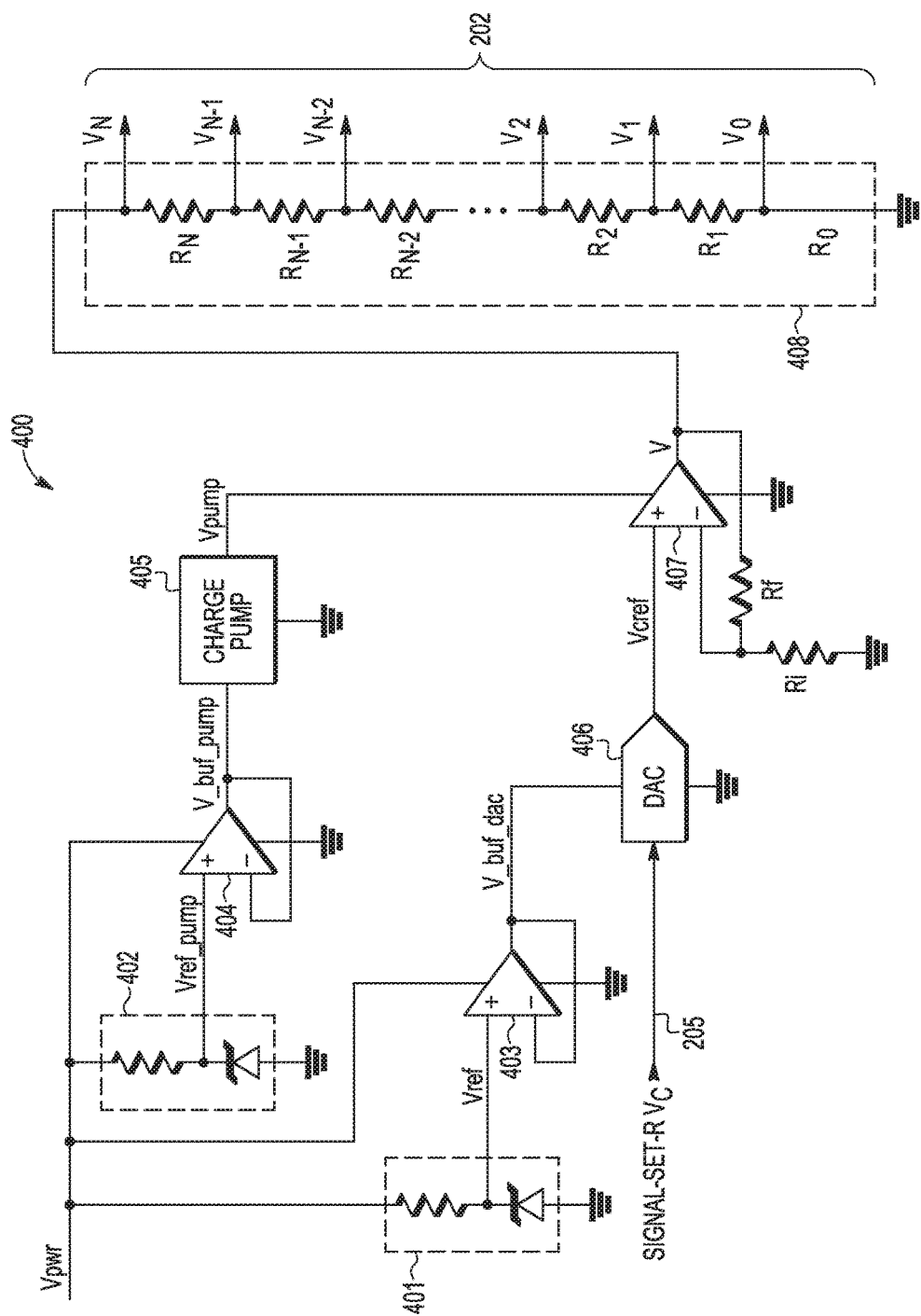
FIG. 4 illustrates a circuit diagram of a portion of a signal injector for producing a set of replacement voltages in accordance with embodiments of the present invention.
Figure 5:
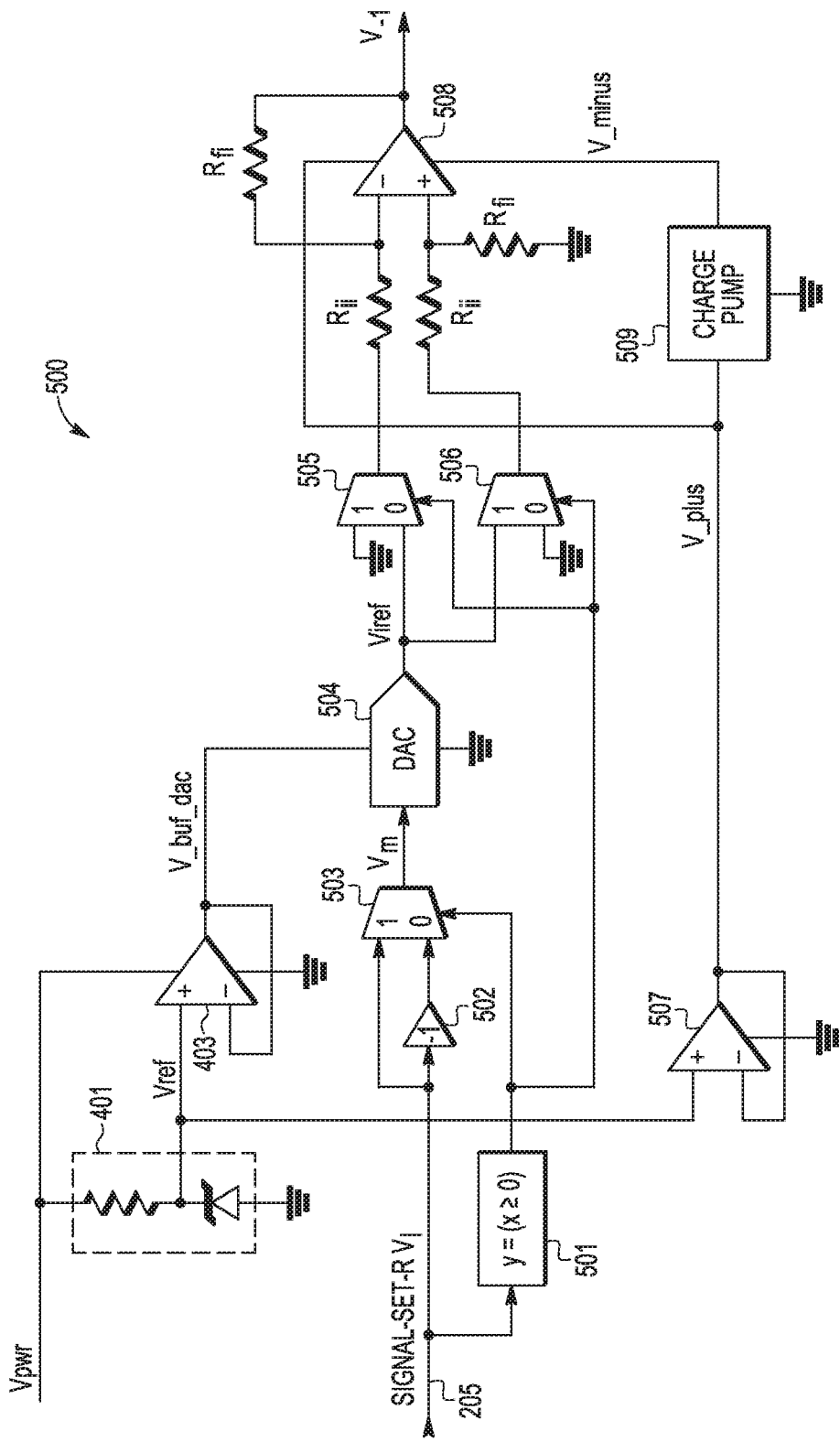
FIG. 5 illustrates a circuit diagram of a portion of a signal injector for producing a replacement current in accordance with embodiments of the present invention.

In step 807, the signal injector 213 produces the Replacement Physical Set 202 in response to receipt of the Signal-Set-R 205, as further described with respect to FIGS. 4-5. In step 808, the multiplexer 208 selects the Replacement Physical Set 202 for input into the sensor circuit 210 in response to receipt of the Replace Command signal 204 from the reference circuit 209. The sensor circuit 210 measures the values of the Replacement Physical Set 202 in a similar manner as it had measured the Physical Set 201. In step 809, this measured Replacement Physical Set is converted by the sensor circuit 210 to a new version of the Signal-Set 206 and sent to the controller 215. In step 810, the controller 215 may store this version of the Signal-Set 206 in a second set of registers (not shown).

In step 811, the controller 215 may check for a variance (within a predetermined threshold) between the two previous versions of the Signal-Set 206. In other words, the controller 215 may compare the previously received Signal-Set 206 corresponding to the measured Physical Set 201 received from the battery pack 210 to the measured Replacement Physical Set 202 produced by the signal injector 213 resulting from the Signal-Set-R 205 from the reference circuit 209 (for example, by utilizing one or more comparators (not shown) for comparing the values stored in the first set of registers to those stored in the second set of registers)). In step 812, the controller 215 then determines with such comparators whether there is a variance (within a predetermined threshold) between the two stored Signal-Sets. If not, then the process may return in step 814 to the start 801 of the process 800.

However, if there is a variance resulting from the comparison, then the controller 215 may output the Switch Command signal 207 (or any other type of signal as desired). The controller 215 may implement any suitable circuitry and/or algorithm (including in software and/or hardware) for determining the criteria for outputting the Switch Command signal 207 as a function of the comparison of the measured Physical Set to the measured Replacement Physical Set. Such criteria may include a variance (within a predetermined threshold) between one or more corresponding ones of the compared measured Physical Set and measured Replacement Physical Set. As an example, if a variance occurs K times out of N consecutive times, with K<N, where DT=K*T is the system FTTI, this may indicate that the battery pack is no longer operating within a safe operating state. In such an instance, it sends a Switch Command signal 207 (e.g., to an emergency switch actuator 217), which may be normally closed, to open this emergency switch actuator 217 so that the battery pack 210 reaches a safe state (e.g., by disconnecting the battery cells from a charging source).

A portion 400 of the signal injector 213 is further described with the circuit diagram of FIG. 4. This circuitry 400 of the signal injector 213 is configured to emulate the voltages of the N battery cells in the battery pack 210.

A power supply voltage, Vpwr, is received (e.g., from the power supply 308) by the voltage reference circuit 401, the voltage reference circuit 402, the buffer 403, and the buffer 404. The voltage reference circuit 401 is configured to provide a predetermined input voltage, V_ref_dac, into the positive input of the buffer 403, which outputs a predetermined input voltage, V_buf_dac, for the digital-to-analog converter ("DAC") 406. An exemplary voltage value for V_buf_dac may be about 5 volts.

The voltage reference circuit 402 is configured to provide a predetermined input voltage, Vref_pmp, into the positive input of the buffer 404 for providing a predetermined input voltage, V_buf_pmp, to the charge pump 405. An exemplary voltage value for V_buf_pmp may be about 10 volts. The charge pump 405, driven by the input voltage, V_buf_pmp, multiplies this input voltage by a positive integer factor M. As an example, M could be equal to about 6. The produced voltage, Vpump, provides the gain for the amplifier 407. The current buffers 403 and 404 each provide current capability with a unity gain.

The Signal-Set-R $V_C$ set point value received from the reference circuit 209 is input into the DAC 406, which converts this digital signal into an analog signal, Vcref, which is received into the non-inverting input of the amplifier 407. The inverting input to the amplifier 407 may be coupled to ground through a resistor Ri. The inverting input to the amplifier 407 may be tied to its output through a resistor Rf. The values of the resistors Ri and Rf may take on any suitable resistance values so that the ratio of those resistances provides a gain, G, for the amplifier 407 given by G=1+Rf/Ri.

The resistors 408 (with resistance values $R_i$, where i=0 . . . N) may be configured to emulate voltages of the battery cells of the battery pack 210. The resistance values $R_i$ may have arbitrary values (e.g., a uniform distribution of resistance values within ±10% around a nominal value). Within embodiments of the present invention, the resistors 408 produces a portion of the Replacement Physical Set 202 that is input into the multiplexer 208, as shown in FIGS. 2 and 3. In this example, this portion of the Replacement Physical Set 202 produces voltages $V_0 \ldots V_N$, which are configured to correspond to the voltages $V'_0 \ldots V'_N$ from the battery cells of the battery pack 210. As a non-limiting example, if there are 16 cells in the battery pack 210, then the resistors 408 may be configured with N resistance values $R_i$, and then the gain, G, of the amplifier 407 may be configured with a gain of G=16 (hence, Rf/Ri=15).

For any pair of these voltage outputs, i and i−1, the associated difference of potential $\Delta V_i$ is given by the following Equation [1]:

$$\Delta V_i = V_c \cdot g \cdot G \cdot R_i \left( \sum_{k=1}^{N} R_k \right)^{-1} \{i = 1 \ldots N\}$$

where g is the gain of the DAC 406 (e.g., g=1), and G is the gain of the amplifier 407.

FIG. 5 illustrates a portion 500 of the signal injector 213 configured to produce the voltage $V_{-1}$ for emulating the corresponding voltage $V'_{-1}$ of the Physical Set 201 from the battery stack 210. Note that the current from the current shunt 211 (see FIG. 2) for the Physical Set 201 may be produced by the voltages $V'_0$ and $V'_{-1}$. As seen in FIG. 4, the voltage $V_0$ is produced by the resistors 408.

The circuitry 500 in FIG. 5 may be configured to emulate the behavior of a current shunt (e.g., the current shunt 211 in FIG. 2) providing the voltage $V_{-1}$ for input into the multiplexer 208 and eventual receipt by the sensor circuit 210. A current flowing through a battery cell may have any sign (positive or negative). Note that a typical shunt (e.g., the current shunt 211 in FIG. 2) implemented within a battery pack 210 may have very low resistance (e.g., 100 μΩ), so the voltage drop through it may be very small.

The circuitry 500 illustrated in FIG. 5 may utilize the voltage reference 401 and the current buffer 403 previously described with respect to FIG. 4 for producing an input voltage, V_buf_dac, to the DAC 504. The Signal-Set-R $V_I$ set point value from the reference circuit 209 is received by the logic circuitry 501 and the inverting buffer 502.

The DAC 504 may be configured to work only with an ever positive digital input. A reason for such a configuration is that such a DAC is less expensive and more accurate. Therefore, the circuitry 500 may be configured with a multiplexer 503 and an inverting buffer 502 implemented within the input path of the DAC 504 so that both signs of the Signal-Set-R $V_I$ set point value are properly managed. The logic circuit 501 has a Boolean output, y, of a logic 1 when the input, x, is greater than or equal to zero; else it is a logic 0. If the selection input (i.e., the output from the logic circuit 501) to the multiplexer 503 is a logic 1, then the input labeled as 1 is selected for output from the multiplexer 503, otherwise the input labeled as 0 is selected. The DAC 504 converts the digital signal $V_m$ from the multiplexer 503 into an analog signal, Viref. $V_m$ is the absolute value of the Signal-Set-R $V_I$ set point value received by the logic circuits 502 and 503; therefore, Viref is a positive value.

The multiplexers 505, 506 may be configured in order to properly manage both inputs of the differential amplifier 508, considering that Viref is a positive value. As a result of the configurations of the logic circuits 505 and 506, if the sign of the digital input of the Signal-Set-R $V_I$ set point value is positive, the output Viref of the DAC 504 is sent to the non-inverting input of the differential amplifier 508; otherwise, it is sent to the inverting input of the differential amplifier 508. A result is that the output voltage $V_{-1}$ of the differential amplifier 508 has a sign (positive or negative) that follows the sign of the received Signal-Set-R $V_I$ set point value.

The differential amplifier 508 operates as an attenuator, accepting a differential voltage, which may have any sign (positive or negative). Since the differential input to the differential amplifier 508 may attain any sign, the differential amplifier 508 is supplied with both positive and negative voltages by the charge pump 509. The current buffer 507 provides current capability with a unity gain producing a voltage, V_plus, to the input of the charge pump 509 and to the differential amplifier 508. The charge pump 509 multiplies the input voltage, V_plus, by a negative factor (e.g., −1). As an example, the voltage, V_plus, may be about 5 volts, and the output voltage, V_minus, from the charge pump 509 may be about −5 volts.

The output voltage $V_{-1}$ of the differential amplifier 508 is given by Equation [2]:

$$V_{-1} = g_I \cdot G_I \cdot V_I$$

wherein $g_I$ is the gain of the DAC 504 (e.g., $g_I=1$), and $G_I$ is the gain of the differential amplifier 508.

Note that it would be seem to be convenient for all of the gains in Equation [1] to be equal to each other. However, within embodiments of the present invention, in order for the safety mechanism of embodiments of the present invention to have a higher diagnostic coverage, the resistors $R_1 \ldots R_N$ may be assigned different values so that the corresponding emulated cell voltages assume different values. Such a configuration may be able to achieve the capability of recognizing the different channels entering the sensor circuit 210 by marking them individually. With such a configuration, the controller 215 will be programmed to have knowledge of all those gains, including $G_I$ in Equation [2] so that the controller 215 can check for the expected values.

Figure 9:
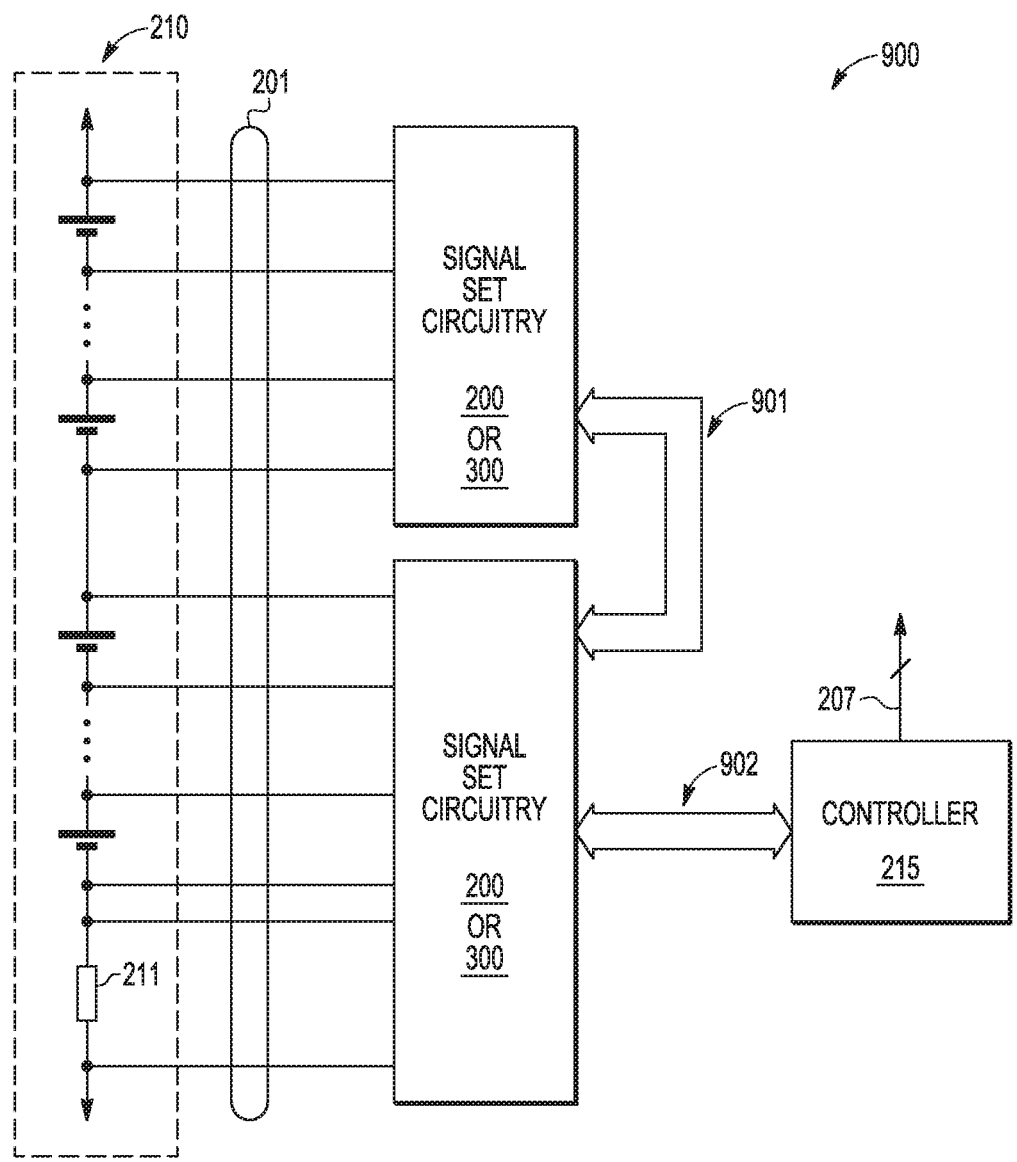
FIG. 9 illustrates an exemplary configuration of a battery monitoring system in accordance with embodiments of the present invention.

FIG. 9 illustrates embodiments of the present invention implementing a system 900 whereby two or more of the Signal-Set circuitry 200, 300 may be implemented in order to perform a monitoring of a battery pack 210. In such a configuration, each of the Signal-Set circuitries 200, 300 are implemented to monitor a certain number of the battery cells within the battery pack 210, with one of the Signal-Set circuitry 200, 300 also monitoring the current within the battery pack 210. Additionally, within such embodiments, a signal controller 215 may communicate over the buses 901, 902 with the Signal-Set circuitries 200, 300, including have an ability to address each of the Signal-Set circuitries 200, 300 on an individual addressable basis.

Figure 10:
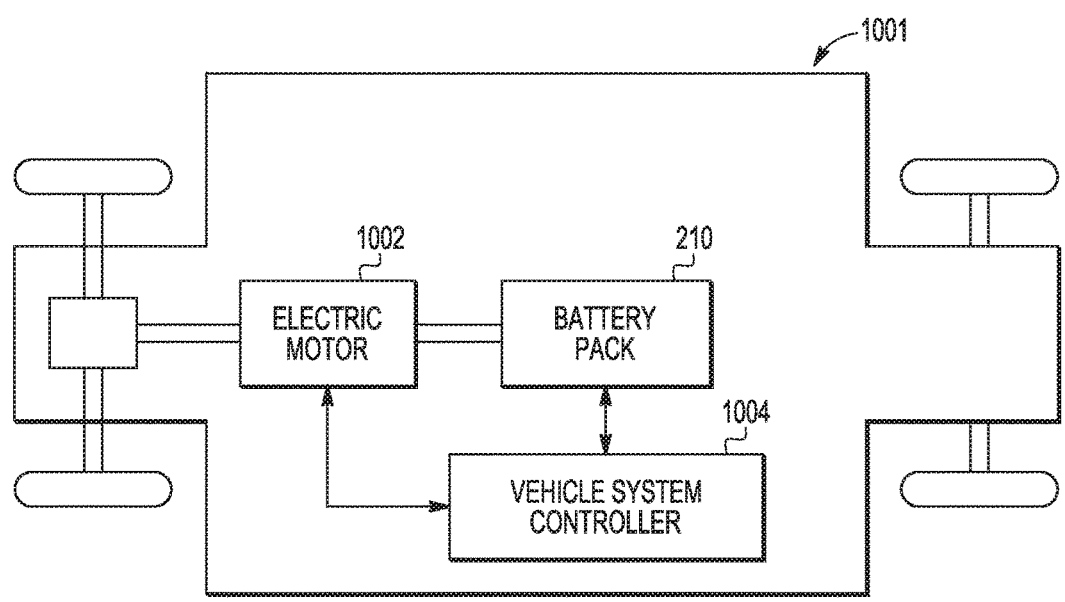
FIG. 10 illustrates an exemplary configuration of a vehicle implementing a battery monitoring device in accordance with embodiments of the present invention.

FIG. 10 illustrates embodiments of the present invention in which a battery pack 210 is utilized within some sort of vehicle 1001 for supplying electric power to an electric motor 1002. The electric motor 1002 may be configured to power the vehicle 1001, such as for powering its drive train and/or other accessories. A vehicle system controller 1004 may then implement the battery monitoring device disclosed within embodiments of the present invention, which may include a single Signal-Set circuitry 200, 300 coupled to a controller 215, or a battery monitoring system with multiple Signal-Set circuitries 200, 300, such as system 900 illustrated in FIG. 9.

Aspects of the present invention provide a battery monitoring device configured to monitor performance of one or more battery cells including a signal injector configured to produce a replacement physical set that emulates one or more physical properties associated with the one or more battery cells, and a multiplexer configured to selectively output, during different periods of time, the replacement physical set received from the signal injector or a physical set of physical properties received from the one or more battery cells. The battery monitoring device may further include a controller configured to compare the physical set to the replacement physical set for a variance outside of a predetermined threshold. The controller may be configured to switch the one or more battery cells into a safe state when the comparison of the physical set to the replacement physical set results in the variance outside of the predetermined threshold. The replacement physical set may be predetermined physical quantities that emulate a threshold range of physical properties produced during normal or safe operation of the one or more battery cells. The battery monitoring device may further include a sensor circuit configured to separately convert (1) the physical set to a first signal set representing a first digitized measurement of the physical set, and (2) the replacement physical set to a second signal set representing a second digitized measurement of the replacement physical set, wherein the controller compares the first signal set to the second signal set for the variance outside of the predetermined threshold. The battery monitoring device may be configured as a single integrated circuit, wherein the sensor circuit is separated from the signal injector and the multiplexer by a common mode failure barrier. The signal injector may further include a digital-to-analog converter configured to convert a received digitized voltage set-point value from the controller to thereby output a corresponding analog voltage set-point value, a first amplifier configured to amplify the analog voltage set-point value, and a resistor network configured to produce the replacement physical set emulating one or more voltages of the one or more battery cells as a function of the amplified analog voltage set-point value. The signal injector may further include a charge pump configured to power the first amplifier, a second amplifier configured to amplify a first reference voltage for input into the charge pump, and a third amplifier configured to amplify a second reference voltage to power the digital-to-analog converter. The resistor network may include a plurality of series-connected resistors configured to receive the amplified analog voltage set-point value to thereby produce a plurality of voltages emulating voltages of the one or more battery cells.

Aspects of the present invention provide a method for monitoring performance of battery cells in a battery pack including converting a physical set of physical properties received from the battery cells to a first signal set representing a first digitized measurement of the physical set, producing a replacement physical set that emulates one or more physical properties associated with the battery cells, converting the replacement physical set to a second signal set representing a second digitized measurement of the replacement physical set, and comparing the first signal set to the second signal set for a variance outside of a predetermined threshold. The method may further include, in response to a determination that the comparison of the first signal set to the second signal set results in the variance outside of the predetermined threshold, outputting a switch command suitable to switch the battery cells into a safe state. The replacement physical set may be predetermined physical quantities that emulate a threshold range of physical properties produced during normal or safe operation of the battery cells. The producing of the replacement physical set may further include converting a received digitized voltage set-point value into a corresponding analog voltage set-point value, amplifying the analog voltage set-point value, and producing with a resistor network the replacement physical set emulating voltages of the battery cells as a function of the amplified analog voltage set-point value. The resistor network may include a plurality of series-connected resistors configured to receive the amplified analog voltage set-point value to thereby produce a plurality of voltages emulating voltages of the battery cells.

Aspects of the present invention provide a vehicle including an electric motor configured to power the vehicle, a battery pack configured to power the electric motor, and a vehicle system controller configured to control operation of the electric motor and the battery pack, wherein the vehicle system controller includes a battery monitoring device configured to monitor performance of one or more battery cells within the battery pack. The battery monitoring device may include a signal injector configured to produce a replacement physical set that emulates one or more physical properties associated with the one or more battery cells, and a multiplexer configured to selectively output, during different periods of time, the replacement physical set received from the signal injector or a physical set of physical properties received from the one or more battery cells. The battery monitoring device may further include a sensor circuit configured to (1) convert the physical set to a first signal set representing a first digitized measurement of the physical set, and (2) convert the replacement physical set to a second signal set representing a second digitized measurement of the replacement physical set, and a controller configured to compare the first signal set to the second signal set for the variance outside of the predetermined threshold. The controller may be configured to switch the one or more battery cells into a safe state when the comparison of the first signal set representing the first digitized measurement of the physical set to the second signal set representing the second digitized measurement of the replacement physical set results in the variance outside of the predetermined threshold. The replacement physical set may be predetermined physical quantities that emulate a threshold range of physical properties produced during normal or safe operation of the one or more battery cells. The signal injector may further include a digital-to-analog converter configured to convert a received digitized voltage set-point value from the controller to thereby output a corresponding analog voltage set-point value, a first amplifier configured to amplify the analog voltage set-point value, a resistor network configured to produce the replacement physical set emulating one or more voltages of the one or more battery cells as a function of the amplified analog voltage set-point value, a charge pump configured to power the first amplifier, a second amplifier configured to amplify a first reference voltage for input into the charge pump, and a third amplifier configured to amplify a second reference voltage to power the digital-to-analog converter. The resistor network may include a plurality of series-connected resistors configured to receive the amplified analog voltage set-point value to thereby produce a plurality of voltages emulating voltages of the one or more battery cells.

Because the foregoing illustrated examples may for the most part be implemented using electronic components and circuits known to those skilled in the art, details were not explained in any greater extent than that considered necessary for the understanding and appreciation of the underlying concepts of the examples set forth herein, and in order not to obfuscate or distract from the teachings herein.

As used herein with respect to an identified property or circumstance, "substantially" refers to a degree of deviation that is sufficiently small so as to not measurably detract from the identified property or circumstance. The exact degree of deviation allowable may in some cases depend on the specific context. The singular forms "a," "an," and "the" include plural referents unless the context clearly dictates otherwise.

Any steps recited in any method or process claims may be executed in any order and are not limited to the order presented in the claims. Means-plus-function or step-plus function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

Aspects of the present invention are described herein with reference to flowchart illustrations and/or block diagrams of methods, apparatus (systems) and computer program products according to embodiments of the invention. It will be understood that each block of the flowchart illustration and/or block diagrams, and combinations of blocks in the flowchart illustration and/or block diagrams, can be implemented by computer program instructions. These computer program instructions may be provided to a processor of a general purpose computer, special purpose computer, or other programmable data processing apparatus (e.g., the signal set circuitry 200 and/or 300, and the controller 215) to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object-oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The invention claimed is:

1. A battery monitoring device configured to monitor performance of one or more battery cells, comprising:
a signal injector configured to produce a replacement physical set that emulates one or more physical properties associated with the one or more battery cells; and
a multiplexer configured to selectively output, during different periods of time, the replacement physical set received from the signal injector or a physical set of physical properties received from the one or more battery cells.

2. The battery monitoring device as recited in claim 1, further comprising a controller configured to compare the physical set to the replacement physical set for a variance outside of a predetermined threshold.

3. The battery monitoring device as recited in claim 2, wherein the controller is configured to switch the one or more battery cells into a safe state when the comparison of the physical set to the replacement physical set results in the variance outside of the predetermined threshold.

4. The battery monitoring device as recited in claim 2, further comprising a sensor circuit configured to separately convert (1) the physical set to a first signal set representing a first digitized measurement of the physical set, and (2) the replacement physical set to a second signal set representing a second digitized measurement of the replacement physical set, wherein the controller compares the first signal set to the second signal set for the variance outside of the predetermined threshold.

5. The battery monitoring device as recited in claim 4, wherein the battery monitoring device is configured as a single integrated circuit, wherein the sensor circuit is separated from the signal injector and the multiplexer by a common mode failure barrier.

6. The battery monitoring device as recited in claim 2, wherein the signal injector further comprises:
 a digital-to-analog converter configured to convert a received digitized voltage set-point value from the controller to thereby output a corresponding analog voltage set-point value;
 a first amplifier configured to amplify the analog voltage set-point value; and
 a resistor network configured to produce the replacement physical set emulating one or more voltages of the one or more battery cells as a function of the amplified analog voltage set-point value.

7. The battery monitoring device as recited in claim 6, wherein the signal injector further comprises:
 a charge pump configured to power the first amplifier;
 a second amplifier configured to amplify a first reference voltage for input into the charge pump; and
 a third amplifier configured to amplify a second reference voltage to power the digital-to-analog converter.

8. The battery monitoring device as recited in claim 7, wherein the resistor network comprises a plurality of series-connected resistors configured to receive the amplified analog voltage set-point value to thereby produce a plurality of voltages emulating voltages of the one or more battery cells.

9. The battery monitoring device as recited in claim 1, wherein the replacement physical set are predetermined physical quantities that emulate a threshold range of physical properties produced during normal or safe operation of the one or more battery cells.

10. A method for monitoring performance of battery cells in a battery pack, comprising:
 converting a physical set of physical properties received from the battery cells to a first signal set representing a first digitized measurement of the physical set;
 producing a replacement physical set that emulates one or more physical properties associated with the battery cells;
 converting the replacement physical set to a second signal set representing a second digitized measurement of the replacement physical set; and
 comparing the first signal set to the second signal set for a variance outside of a predetermined threshold.

11. The method as recited in claim 10, further comprising, in response to a determination that the comparison of the first signal set to the second signal set results in the variance outside of the predetermined threshold, outputting a switch command suitable to switch the battery cells into a safe state.

12. The method as recited in claim 10, wherein the replacement physical set are predetermined physical quantities that emulate a threshold range of physical properties produced during normal or safe operation of the battery cells.

13. The method as recited in claim 10, wherein the producing the replacement physical set further comprises:
 converting a received digitized voltage set-point value into a corresponding analog voltage set-point value;
 amplifying the analog voltage set-point value; and
 producing with a resistor network the replacement physical set emulating voltages of the battery cells as a function of the amplified analog voltage set-point value.

14. The method as recited in claim 13, wherein the resistor network comprises a plurality of series-connected resistors configured to receive the amplified analog voltage set-point value to thereby produce a plurality of voltages emulating voltages of the battery cells.

15. A vehicle comprising:
 an electric motor configured to power the vehicle;
 a battery pack configured to power the electric motor; and
 a vehicle system controller configured to control operation of the electric motor and the battery pack, wherein the vehicle system controller comprises a battery monitoring device configured to monitor performance of one or more battery cells within the battery pack, the battery monitoring device comprising:
  a signal injector configured to produce a replacement physical set that emulates one or more physical properties associated with the one or more battery cells; and
  a multiplexer configured to selectively output, during different periods of time, the replacement physical set received from the signal injector or a physical set of physical properties received from the one or more battery cells.

16. The vehicle as recited in claim 15, wherein the battery monitoring device further comprises:
 a sensor circuit configured to (1) convert the physical set to a first signal set representing a first digitized measurement of the physical set, and (2) convert the replacement physical set to a second signal set representing a second digitized measurement of the replacement physical set; and
 a controller configured to compare the first signal set to the second signal set for the variance outside of the predetermined threshold.

17. The vehicle as recited in claim 16, wherein the controller is configured to switch the one or more battery cells into a safe state when the comparison of the first signal set representing the first digitized measurement of the physical set to the second signal set representing the second digitized measurement of the replacement physical set results in the variance outside of the predetermined threshold.

18. The vehicle as recited in claim 17, wherein the replacement physical set are predetermined physical quantities that emulate a threshold range of physical properties produced during normal or safe operation of the one or more battery cells.

19. The vehicle as recited in claim 16, wherein the signal injector further comprises:
 a digital-to-analog converter configured to convert a received digitized voltage set-point value from the controller to thereby output a corresponding analog voltage set-point value;
 a first amplifier configured to amplify the analog voltage set-point value;
 a resistor network configured to produce the replacement physical set emulating one or more voltages of the one or more battery cells as a function of the amplified analog voltage set-point value;
 a charge pump configured to power the first amplifier;
 a second amplifier configured to amplify a first reference voltage for input into the charge pump; and
 a third amplifier configured to amplify a second reference voltage to power the digital-to-analog converter.

20. The vehicle as recited in claim 19, wherein the resistor network comprises a plurality of series-connected resistors configured to receive the amplified analog voltage set-point value to thereby produce a plurality of voltages emulating voltages of the one or more battery cells.

\* \* \* \* \*